(12) United States Patent
Antonyan et al.

(10) Patent No.: US 10,910,030 B2
(45) Date of Patent: Feb. 2, 2021

(54) MEMORY DEVICE FOR REDUCING LEAKAGE CURRENT

(71) Applicant: Samsung Electronics Co., Ltd., Suwon-si (KR)

(72) Inventors: Artur Antonyan, Suwon-si (KR); Hyuntaek Jung, Seoul (KR); Suk-Soo Pyo, Hwaseong-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 0 days.

(21) Appl. No.: 16/390,170

(22) Filed: Apr. 22, 2019

(65) Prior Publication Data

US 2020/0090724 A1  Mar. 19, 2020

(30) Foreign Application Priority Data

Sep. 17, 2018  (KR) ........................ 10-2018-0110997

(51) Int. Cl.
*G11C 11/16* (2006.01)

(52) U.S. Cl.
CPC ........ *G11C 11/1673* (2013.01); *G11C 11/161* (2013.01); *G11C 11/1697* (2013.01)

(58) Field of Classification Search
CPC ............ G11C 11/1673; G11C 11/1697; G11C 11/161
See application file for complete search history.

(56) References Cited

U.S. PATENT DOCUMENTS

| | | | |
|---|---|---|---|
| 6,400,608 B1* | 6/2002 | Fastow | G11C 16/3422 365/185.2 |
| 8,004,880 B2 | 8/2011 | Yoon et al. | |
| 8,274,819 B2* | 9/2012 | Yang | G11C 7/02 365/158 |
| 8,274,820 B2 | 9/2012 | Ogimoto | |
| 9,110,484 B2 | 8/2015 | Zanetta et al. | |
| 9,111,623 B1 | 8/2015 | Jung et al. | |
| 9,390,793 B1 | 7/2016 | Nigam et al. | |
| 9,691,459 B2 | 6/2017 | Seo et al. | |
| 10,453,532 B1* | 10/2019 | Antonyan | G11C 16/10 |
| 2007/0140015 A1* | 6/2007 | Kawamura | G11C 16/344 365/185.22 |
| 2012/0155146 A1* | 6/2012 | Ueda | G11C 11/1659 365/148 |

(Continued)

Primary Examiner — Khamdan N. Alrobaie
(74) Attorney, Agent, or Firm — Harness, Dickey & Pierce, P.L.C.

(57) ABSTRACT

A memory device including a normal memory cell array including a first magneto-resistance memory cell that is connected to a first bit line, a first source line, and a first word line, and configured to receive a selection voltage through the first word line, a monitor memory cell array including a second magneto-resistance memory cell that is connected to a first signal line and a second signal line, a gate of a cell transistor of which is configured to receive a non-selection voltage, and a body bias generator configured to sense a leakage current flowing through the first signal line and control a body voltage provided to each of a body of a cell transistor of the first magneto-resistance memory cell and a body of the cell transistor of the second magneto-resistance memory cell based on the leakage current may be provided.

20 Claims, 12 Drawing Sheets

(56) References Cited

U.S. PATENT DOCUMENTS

| | | | |
|---|---|---|---|
| 2013/0058169 A1* | 3/2013 | Lee | G11C 16/06 |
| | | | 365/185.21 |
| 2016/0379708 A1* | 12/2016 | Katayama | G11C 11/1675 |
| | | | 365/148 |
| 2019/0051351 A1* | 2/2019 | Pyo | G11C 13/0028 |

* cited by examiner

MEMORY DEVICE FOR REDUCING LEAKAGE CURRENT

CROSS-REFERENCE TO RELATED APPLICATIONS

This application claims priority under 35 U.S.C. § 119 to Korean Patent Application No. 10-2018-0110997, filed on Sep. 17, 2018, in the Korean Intellectual Property Office, the disclosure of which is incorporated by reference herein in its entirety.

BACKGROUND

Example embodiments of the inventive concepts disclosed herein relate to semiconductor devices, and more particularly, to memory devices for reducing a leakage current.

A memory device may include memory cells and may store data in the memory cells. A memory device that needs power to retain data stored in memory cells is referred to as a "volatile memory device". A memory device that does not need power to retain data stored in memory cells is referred to as a "nonvolatile memory device".

A memory device may include a magnetic random access memory (MRAM) which is one of nonvolatile memory devices. The MRAM supports a relatively high-speed write operation and a high-speed read operation and operates with a relatively low power, thus is very useful for data storage applications. The MRAM stores data in a variable resistance element of a memory cell, which is implemented with a magneto-resistance element.

One MRAM memory cell connected to a particular bit line may be selected to read data stored therein, and data stored in the selected memory cell may be output. A leakage current may flow from unselected memory cells of memory cells connected to the particular bit line. In the case where a leakage current increases, an error may occur with regard to data which are output from the selected memory cell. For example, a leakage current may increase as a temperature increases, and thus the probability that the error occurs with regard to the output data occurs may increase.

SUMMARY

Some example embodiments of the inventive concepts provide memory devices which may reduce the probability that an error occurs with regard to output data, by adjusting a leakage current flowing in memory cells.

According to an example embodiment, a memory device may include a normal memory cell array including a first magneto-resistance memory cell, the first magneto-resistance memory cell connected to a first bit line, a first source line, and a first word line, the first magneto-resistance memory cell configured to receive a selection voltage through the first word line, a monitor memory cell array including a second magneto-resistance memory cell, the second magneto-resistance memory cell connected to a first signal line and a second signal line, a gate of a cell transistor of the second magneto-resistance memory cell configured to receive a non-selection voltage, and a body bias generator configured to sense a leakage current flowing through the first signal line, and control a body voltage provided to each of a body of a cell transistor of the first magneto-resistance memory cell and a body of the cell transistor of the second magneto-resistance memory cell based on the leakage current.

According to an example embodiment, a memory device may include a normal memory cell array including a first magneto-resistance memory cell, the first magneto-resistance memory cell connected to a first bit line, a first source line, and a first word line, the first magneto-resistance memory cell configured to receive a selection voltage through the first word line, a monitor memory cell array including a second magneto-resistance memory cell, the second magneto-resistance memory cell connected to a first signal line and a second signal line, a gate of a cell transistor of the second magneto-resistance memory cell configured to receive a non-selection voltage, a leakage current generator configured to sense a leakage current flowing through the first signal line, and a negative charge pump configured to a body voltage provided to each of a body of a cell transistor of the first and second magneto-resistance memory cell and a body of the cell transistor of the second magneto-resistance memory cell when the leakage current is greater than a threshold value.

According to an example embodiment, a memory device may include a normal memory cell array including normal magneto-resistance memory cells, the normal magneto-resistance memory cells connected to a first bit line, a first source line, and respective ones of a plurality of word lines, a monitor memory cell array including monitor magneto-resistance memory cells, the magneto-resistance memory cells connected to a first signal line, a second signal line, and a third signal line, gates of the cell transistors of the monitor magneto-resistance memory cells connected to the third signal line and configured to receive a non-selection voltage through the third signal line, and a body bias generator configured to sense a leakage current flowing through the first signal line, and control a body voltage provided to a body of each of cell transistors included in the normal magneto-resistance memory cells and the monitor magneto-resistance memory cells based on the leakage current.

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art easily implements the inventive concepts.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
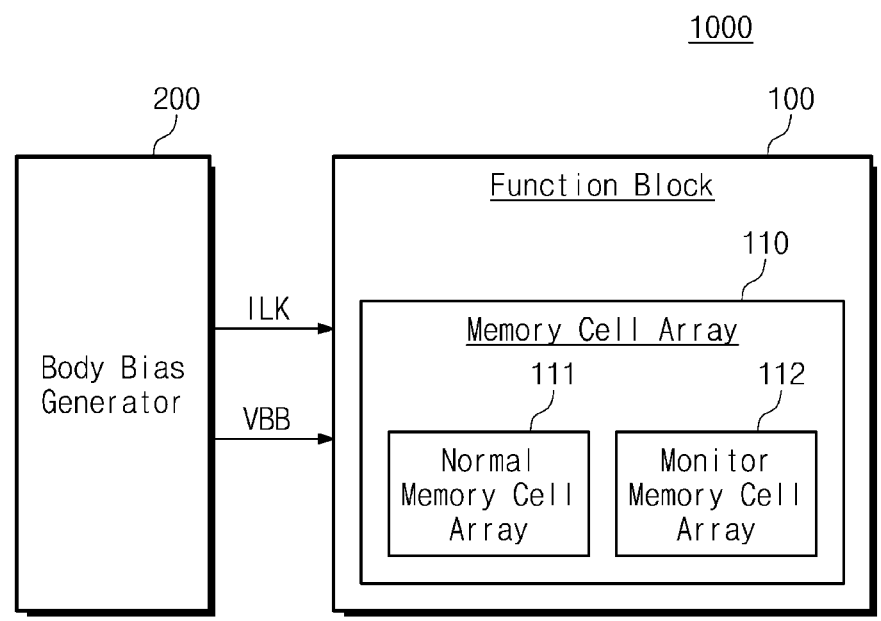
FIG. 1 is a block diagram illustrating a memory device according to an example embodiment of the inventive concepts.

FIG. 1 is a block diagram illustrating a memory device 1000 according to an example embodiment of the inventive concepts. The memory device 1000 may include a volatile memory device (e.g., a dynamic random access memory (DRAM) or a static RAM (SRAM)). The memory device 1000 may include a nonvolatile memory device (e.g., a flash memory device, a magnetic RAM (MRAM) device, a phase-change RAM (PRAM) device, a ferroelectric RAM (FRAM) device, or a resistive RAM (RRAM) device).

Referring to FIG. 1, the memory device 1000 may include a function block 100 and a body bias generator 200. The function block 100 may perform various functions depending on data and/or a control signal provided to the memory device 1000. The function block 100 may include circuits which perform various functions. For example, the function block 100 may include a memory cell array 110 which stores data.

The memory cell array 110 may include a normal memory cell array 111 and a monitor memory cell array 112. The normal memory cell array 111 may include memory cells storing data. The function block 100 may output data stored in the memory cells of the normal memory cell array 111. The monitor memory cell array 112 may include memory cells configured to be identical to the memory cells of the normal memory cell array 111. The memory cells of the monitor memory cell array 112 may not store data. States of the memory cells of the normal memory cell array 111 may be sensed through the monitor memory cell array 112. For example, a leakage current flowing in the normal memory cell array 111 may be sensed through the monitor memory cell array 112.

The function block 100 may include a plurality of transistors. A transistor may be one of the smallest logic units constituting the function block 100. For example, the transistor may include a p-channel metal oxide semiconductor (PMOS) transistor or an n-channel metal oxide semiconductor (NMOS) transistor.

The body bias generator 200 may provide a leakage current ILK to the function block 100. The leakage current ILK may be a current flowing through some transistors in an off state depending on an operation of the function block 100. That is, the body bias generator 200 may allow the leakage current ILK to flow through some transistors of the function block 100. For example, the body bias generator 200 may apply a particular voltage to some transistors of the function block 100. In the case where the particular voltage is applied, the leakage current ILK may flow through some transistors.

In an example embodiment, a leakage current may flow to transistors of the normal memory cell array 111 depending on an operation of the function block 100. The body bias generator 200 may provide the monitor memory cell array 112 with the leakage current ILK which is the same as or substantially identical to a leakage current flowing in the normal memory cell array 111. In this case, the body bias generator 200 may sense the leakage current flowing in the normal memory cell array 111 through the leakage current ILK provided to the monitor memory cell array 112.

The body bias generator 200 may provide the function block 100 with a body voltage VBB for the function block 100. The body voltage VBB may be a voltage which is provided to a body of a transistor in the function block 100. The body bias generator 200 may adjust the body voltage VBB based on the leakage current ILK provided to the function block 100. In an example embodiment, in the case where the leakage current ILK increases, the body bias generator 200 may decrease the body voltage VBB.

In the case where the body voltage VBB is adjusted, a leakage current flowing in the normal memory cell array 111 may be adjusted. For example, in the case where the body voltage VBB decreases, a leakage current flowing in the normal memory cell array 111 may decrease. Because the leakage current ILK is the same as substantially identical to a leakage current flowing in the normal memory cell array 111, the leakage current ILK may also be adjusted as the body voltage VBB is adjusted.

In the case where a leakage current flowing in the normal memory cell array 111 increases depending on the operation of the function block 100, the operation of the function block 100 may not be performed normally. For example, in the case where data stored in the normal memory cell array 111 are read, a read error may increase.

In the case where the body voltage VBB is adjusted based on the leakage current ILK, a leakage current of the normal memory cell array 111 may not increase. Accordingly, the operation of the function block 100 may be performed normally. For example, in the case where an operation of reading data stored in the normal memory cell array 111 is performed, a read error may decrease.

As described above, the body bias generator 200 may adjust the body voltage VBB based on the leakage current ILK provided to the function block 100. This may mean that the memory device 1000 may operate normally and reliability of the memory device 1000 may be improved.

Figure 2:
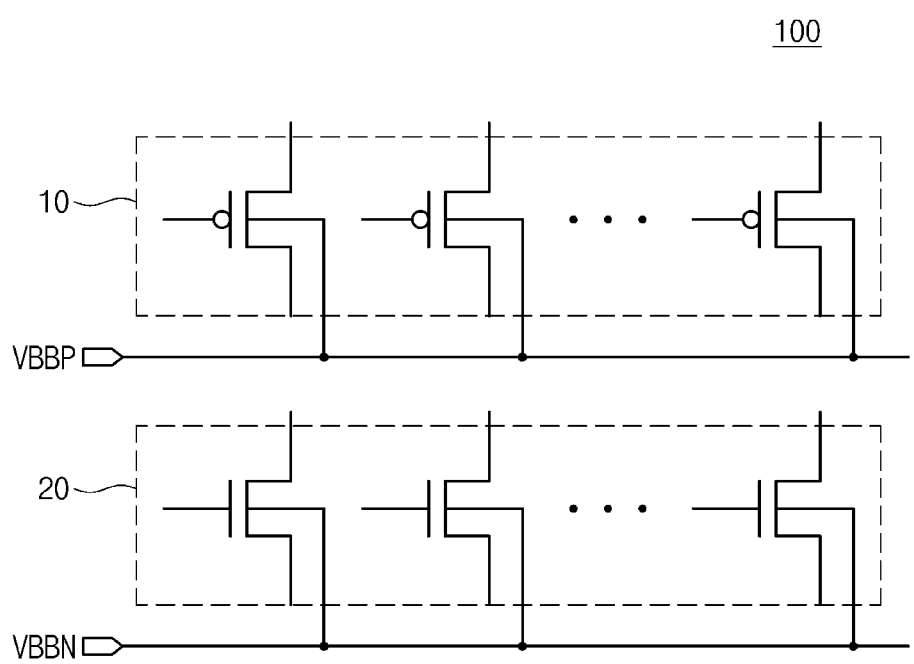
FIG. 2 is a circuit diagram illustrating transistors included in a function block of FIG. 1.

FIG. 2 is a circuit diagram illustrating transistors included in the function block 100 of FIG. 1. Referring to FIG. 2, the function block 100 may include a plurality of PMOS transistors 10 and a plurality of NMOS transistors 20. Although not illustrated in FIG. 2, various elements may be additionally included in the function block 100.

A first end (e.g., a source or a drain) of each PMOS transistor 10 may be connected to a signal line or a first end (e.g., a source or a drain) of any other transistor, and various voltages may be provided to the first end of each PMOS transistor 10. A gate of each PMOS transistor 10 may be connected to a signal line or a terminal of any other transistor, and various voltages may be provided to the gate of each PMOS transistor 10. Because a body of each PMOS transistor 10 is connected to a signal line to which a PMOS body voltage VBBP is provided, and the PMOS body voltage VBBP provided from the body bias generator 200 may be provided to the body of each PMOS transistor 10.

Likewise, a first end (e.g., a source or a drain) of each NMOS transistor 20 may be connected to a signal line or a first end (e.g., a source or a drain) of any other transistor, and various voltages may be provided to the first end of each NMOS transistor 20. A gate of each NMOS transistor 20 may be connected to a signal line or a terminal of any other transistor, and various voltages may be provided to the gate of each NMOS transistor 20. Because a body of each NMOS transistor 20 may be connected to a signal line to which an NMOS body voltage VBBN is provided, the NMOS body voltage VBBN provided from the body bias generator 200 may be provided to the body of each NMOS transistor 20.

As described above, the PMOS body voltage VBBP and the NMOS body voltage VBBN provided from the body bias generator 200 may be respectively provided to the body of each PMOS transistor 10 and the body of each NMOS transistor 20. The body voltage VBB provided from the body bias generator 200 of FIG. 1 may include the PMOS body voltage VBBP and the NMOS body voltage VBBN.

Figure 3A:
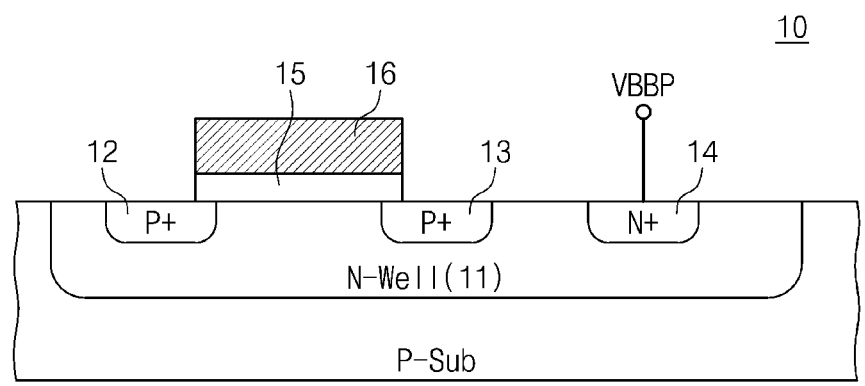
FIGS. 3A and 3B are sectional views illustrating a form of a transistor illustrated in FIG. 2.
Figure 3B:
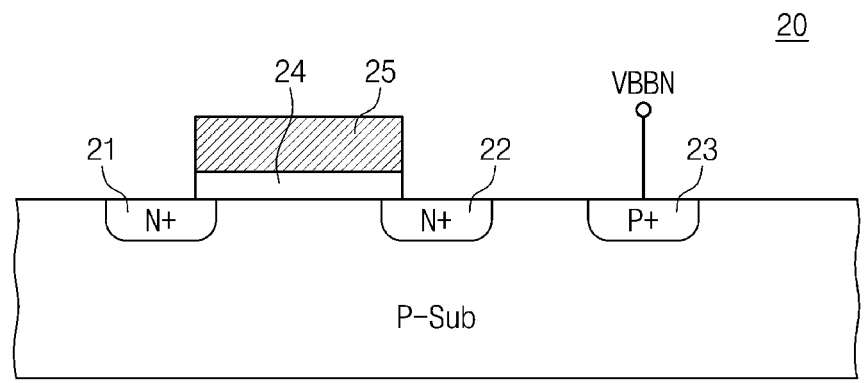

FIGS. 3A and 3B are sectional views illustrating a form of a transistor illustrated in FIG. 2. For example, FIG. 3A shows a sectional view of the PMOS transistor 10, and FIG. 3B shows a sectional view of the NMOS transistor 20.

Referring to FIG. 3A, an N-well 11 may be formed in a P-type substrate P-Sub for the purpose of forming the PMOS transistor 10. The N-well 11 may be formed by injecting N-type dopants into the P-type substrate P-Sub. P+ doping areas 12 and 13 for the drain and source of the PMOS transistor 10 are formed in the N-well 11. An N+ doping area 14 for providing the PMOS body voltage VBBP is formed in the N-well 11. Next, a gate insulating layer 15 and a gate electrode 16 are sequentially stacked. The gate insulating layer 15 may be formed of an oxide layer, a nitride layer, or a stacked layer in which the oxide layer and the nitride layer are stacked. The gate electrode 16 may be formed of a polysilicon layer in which impurity ions (e.g., phosphorus (P), arsenic (As), or boron (B)) are doped or a metal layer.

In the structure of the PMOS transistor 10, a gate voltage may be applied to the gate electrode 16 of the PMOS transistor 10, and a drain voltage and a source voltage may be respectively applied to the P+ doping areas 12 and 13, which serve as drain and source terminals. Also, the PMOS body voltage VBBP may be applied to the N+ doping area 14, which serves as a body electrode of the PMOS transistor 10.

Referring to FIG. 3B, N+ doping areas 21 and 22 for a drain and a source may be formed in the P-type substrate P-Sub for the purpose of forming the NMOS transistor 20. A P+ doping area 23 for providing the NMOS body voltage VBBN is formed in the P-type substrate P-Sub. Next, a gate insulating layer 24 and a gate electrode 25 are sequentially stacked.

In the structure of the NMOS transistor 20, a gate voltage may be applied to the gate electrode 25 of the NMOS transistor 20, and a drain voltage and a source voltage may be respectively applied to the N+ doping areas 21 and 22, which serve as drain and source terminals. Also, the NMOS body voltage VBBN may be applied to the P+ doping area 23, which serves as a body electrode of the NMOS transistor 20.

As described above, the body voltage VBB provided from the body bias generator 200 may be provided to a body of the PMOS transistor 10 through the N+ doping area 14 and a body of the NMOS transistor 20 through the P+ doping area 23. The body bias generator 200 may adjust the body voltage VBB such that threshold voltages Vth of the PMOS and NMOS transistors 10 and 20 are adjusted. Leakage currents flowing through the PMOS and NMOS transistors 10 and 20 may vary with the threshold voltages Vth of the PMOS and NMOS transistors 10 and 20. Accordingly, in the case where the body voltage VBB is adjusted, leakage currents flowing through the PMOS and NMOS transistors 10 and 20 may be adjusted. For example, in the case where the body voltage VBB decreases, the threshold voltages Vth of the PMOS and NMOS transistors 10 and 20 may increase. In this case, the leakage currents flowing through the PMOS and NMOS transistors 10 and 20 may decrease.

Figure 4:
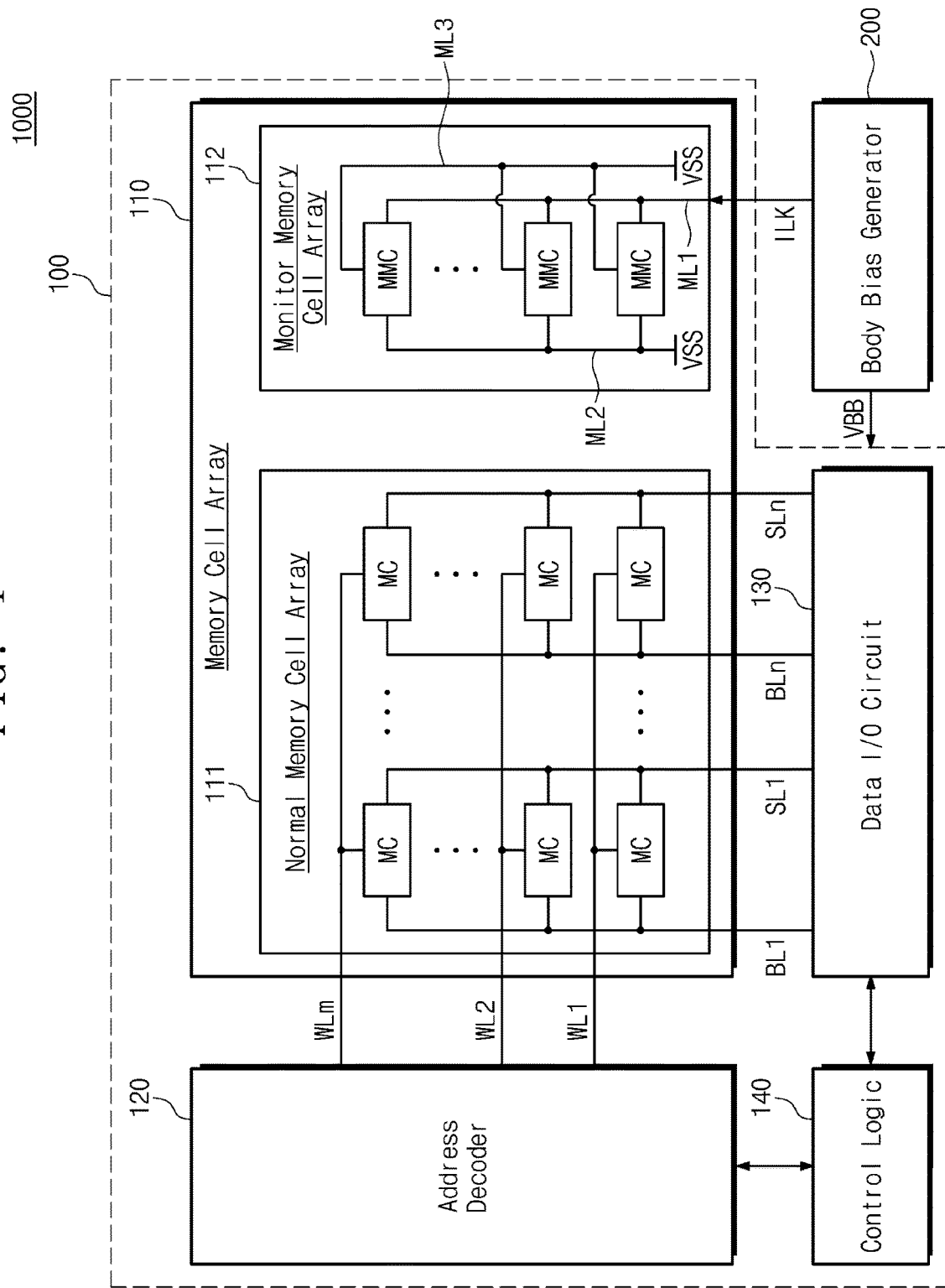
FIG. 4 is a block diagram illustrating a memory device of FIG. 1.

FIG. 4 is a block diagram illustrating the memory device 1000 of FIG. 1. Referring to FIG. 4, the memory device 1000 may include the memory cell array 110, an address decoder 120, a data input/output circuit 130, control logic 140, and the body bias generator 200. The memory cell array 110, the address decoder 120, the data input/output circuit 130, and the control logic 140 may be included in the function block 100.

The memory cell array 110 may include the normal memory cell array 111 and the monitor memory cell array 112. The normal memory cell array 111 may include memory cells MC. The memory cells MC may be connected to source lines SL1 to SLn (n being a positive integer), bit lines BL1 to BLn, and word lines WL1 to WLm (m being a positive integer). The memory cells MC may be arranged in a matrix of rows and columns. The rows of memory cells MC may correspond to the word lines WL1 to WLm, respectively. The columns of memory cells MC may correspond to the source lines SL1 to SLn, respectively, and may correspond to the bit lines BL1 to BLn, respectively.

The monitor memory cell array 112 includes monitor memory cells MMC. The monitor memory cells MMC may be implemented to be identical to the memory cells MC of the normal memory cell array 111. For example, each of the memory cells MC and the monitor memory cells MMC may include a variable resistance element, the resistance value of which is variable. That is, the memory cells MC and the monitor memory cells MMC may be implemented with a resistive memory cell.

The monitor memory cells MMC may be arranged in one column. The monitor memory cells MMC are connected to a first signal line ML1, a second signal line ML2, and a third signal line ML3. The first signal line ML1 may be connected to the body bias generator 200. A ground voltage VSS may be applied to the second signal line ML2 and the third signal line ML3. However, the inventive concepts is not limited thereto. For example, a voltage different from the ground voltage VSS may be applied to the second signal line ML2 and the third signal line ML3.

The address decoder 120 may control voltages of the word lines WL1 to WLm under control of the control logic 140. For example, the address decoder 120 may apply a selection voltage for read or write to a selected word line, and may apply a non-selection voltage for read or write inhibition to unselected word lines.

The data input/output circuit 130 is connected to the source lines SL1 to SLn and the bit lines BL1 to BLn. Under control of the control logic 140, the data input/output circuit 130 may write data to the memory cells MC by using the source lines SL1 to SLn and the bit lines BL1 to BLn. The data input/output circuit 130 may write data to a selected memory cell MC. For example, the data input/output circuit 130 may provide a write voltage to one of a source line and a bit line connected to the selected memory cell MC and may provide a low voltage, for example, the ground voltage VSS to the other thereof.

Under control of the control logic 140, the data input/output circuit 130 may output data stored in the memory cells MC by using the source lines SL1 to SLn and the bit lines BL1 to BLn. The data input/output circuit 130 may output data stored in a selected memory cell MC. For example, the data input/output circuit 130 may provide a read voltage to one of a source line and a bit line connected to the selected memory cell MC, and may provide a low voltage (e.g., the ground voltage VSS) to the other of the source line and the bit line.

The control logic 140 may receive a control signal and an address from an external device (e.g., a memory controller). In response to the control signal and the address, the control logic 140 may control the address decoder 120 and the data input/output circuit 130 such that a write operation or a read operation is performed.

The body bias generator 200 may provide the leakage current ILK to the monitor memory cell array 112. The leakage current ILK may be the same as or substantially identical to a leakage current flowing through the memory cells MC of the normal memory cell array 111 in the write or read operation. The leakage current ILK may be distributed into the respective monitor memory cells MMC through the first signal line ML1. The body bias generator 200 may adjust the body voltage VBB based on the leakage current ILK. The adjusted body voltage VBB may be provided to transistors of the function block 100.

For example, in the read operation associated with a selected memory cell MC connected to the first bit line BL1, the first source line SL1, and the first word line WL1, the selection voltage may be applied to the first word line WL1. The read voltage may be applied to one of the first bit line BL1 and the first source line SL1, and the ground voltage VSS may be applied to the other of the first bit line BL1 and the first source line SL1. As the read voltage is applied to the first bit line BL1 or the first source line SL1, a read current may flow in the selected memory cell MC. A leakage current may flow in the remaining unselected memory cells MC connected between the first bit line BL1 and the first source line SL1. The body bias generator 200 may provide the monitor memory cell array 112 with the leakage current ILK which is the same as or substantially identical to the leakage current flowing in the remaining unselected memory cells MC. The body bias generator 200 may apply the particular voltage to the first signal line ML1 for providing the leakage current ILK. The particular voltage may be identical to the read voltage applied to one of the first bit line BL1 and the first source line SL1. When the particular voltage is applied to the first signal line ML1, the leakage current ILK may flow. The body bias generator 200 may adjust the body voltage VBB based on the leakage current ILK.

In the case where the body voltage VBB is properly adjusted, the leakage current flowing in the memory cell array 110 may decrease. Accordingly, in the read or write operation, a data error which may occur when a read or write current decreases due to the leakage current may decrease.

Figure 5:
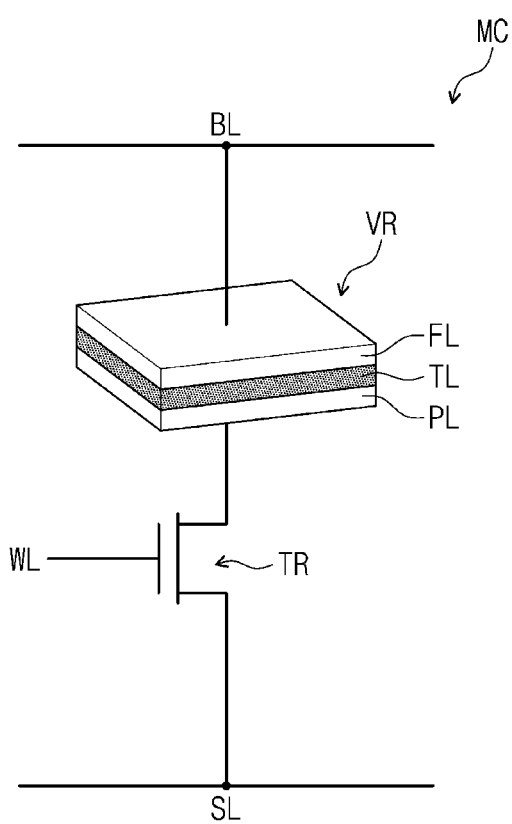
FIG. 5 is a diagram illustrating an example of a memory cell of a memory cell array of FIG. 4.

FIG. 5 is a diagram illustrating an example of a memory cell of the memory cell array 110 of FIG. 4. A memory cell MC of the normal memory cell array 111 is illustrated in FIG. 5. The memory cell MC may include a variable resistance element VR implemented in a magnetic tunnel junction (MTJ) structure and a cell transistor TR. A first end of the variable resistance element VR may be connected to a bit line BL, and a second end thereof may be connected to a first end of the cell transistor TR. A second end of the cell transistor TR may be connected to a source line SL. A gate of the cell transistor TR may be connected to a word line WL. For example, the cell transistor TR may be implemented with a PMOS transistor or an NMOS transistor.

The variable resistance element VR includes a pinned layer PL, a tunneling layer TL, and a free layer FL. The pinned layer PL has a fixed magnetization direction. A magnetization direction of the free layer FL may vary with a voltage (or a current) applied to the variable resistance element VR.

A resistance value of the variable resistance element VR may change depending on whether a magnetization direction of the free layer FL is parallel to a magnetization direction of the pinned layer PL or anti-parallel thereto. The variable resistance element VR may store data depending on a magnitude of a resistance value of the variable resistance element VR. For example, when the variable resistance element VR is in a low-resistance state, data of the memory cell MC may be defined as a low value. When the variable resistance element VR is in a high-resistance state, data of the memory cell MC may be defined as a high value.

Only the memory cell MC of the normal memory cell array 111 is illustrated in FIG. 5, the monitor memory cell MMC of the monitor memory cell array 112 may also include the variable resistance element VR and the cell transistor TR like the memory cell MC.

As described above, the memory device 1000 may include memory cells MC and MMC each including the variable resistance element VR and the cell transistor TR. That is, the memory device 1000 may be implemented with an MRAM. However, the inventive concepts are not limited thereto. For example, the memory device 1000 may be implemented with various kinds of memories. Below, for ease of description, it is assumed that the memory device 1000 is an MRAM.

Figure 6:
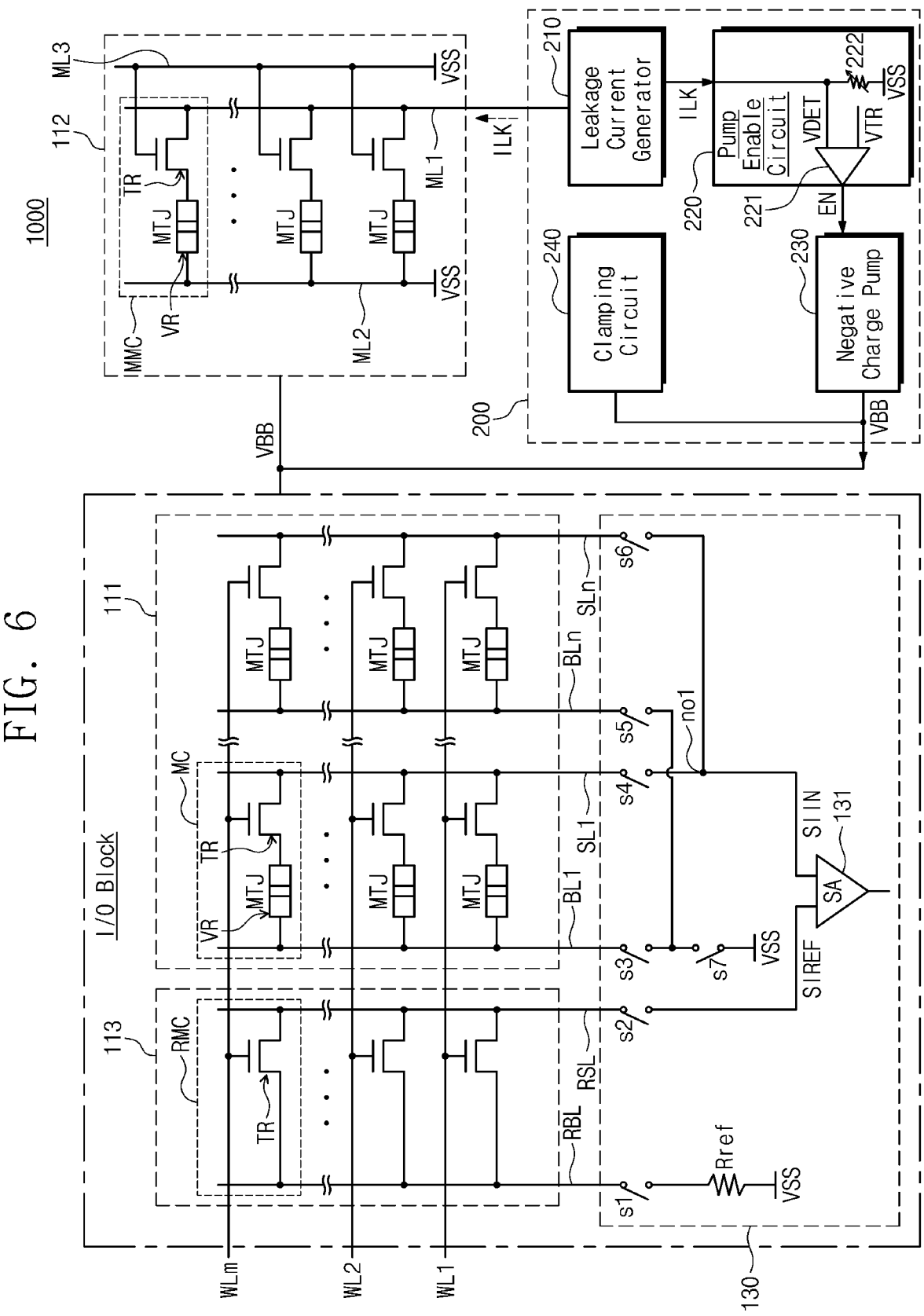
FIG. 6 is a circuit diagram illustrating a memory device of FIG. 4.

FIG. 6 is a circuit diagram illustrating the memory device 1000 of FIG. 4. For example, the memory device 1000 of FIG. 6 is formed of an MRAM, and only circuits used in a read operation are illustrated. However, the inventive concepts are not limited thereto. For example, the inventive concepts also may be applied to a write operation.

Referring to FIG. 6, the memory device 1000 may include the normal memory cell array 111, the monitor memory cell array 112, a reference memory cell array 113, the data input/output circuit 130, and the body bias generator 200. The normal memory cell array 111, the reference memory cell array 113, and the data input/output circuit 130 illustrated in FIG. 6 may be included in a single input/output block. The memory device 1000 may write or output data through an input/output block. As such, the data input/output circuit 130 may include a sense amplifier 131 for outputting a piece of data. Although not illustrated in FIG. 6, the memory device 1000 may include a plurality of input/output blocks.

The normal memory cell array 111 may include a plurality of memory cells MC. Each of the memory cells MC may include the cell transistor TR and the variable resistance element VR implemented in the MTJ structure. A first end of the cell transistor TR may be connected to a particular source line, and a second end thereof may be connected to a first end of the variable resistance element VR. A gate of the cell transistor TR may be connected to a particular word line. A second end of the variable resistance element VR may be connected to a particular bit line. In an operation of the memory device 1000, the ground voltage VSS may be applied to the particular bit line, and the selection voltage or the non-selection voltage may be applied to the particular word line. The selection voltage may be a high voltage which may turn on the cell transistor TR. The non-selection voltage may be a low voltage which may turn off the cell transistor TR. For example, the selection voltage may be a power supply voltage VDD, and the non-selection voltage may be the ground voltage VSS. For example, the selection voltage may be applied to a word line to which the selected memory cell MC is connected, and the ground voltage VSS may be applied to a word line to which an unselected memory cell MC is connected.

The monitor memory cell array 112 includes a plurality of monitor memory cells MMC. Each of the monitor memory cells MMC may include the cell transistor TR and the variable resistance element VR implemented in the MTJ structure. A first end of the cell transistor TR may be connected to the first signal line ML1, and a second end thereof may be connected to a first end of the variable resistance element VR. A gate of the cell transistor TR may be connected to the third signal line ML3. A second end of the variable resistance element VR may be connected to the second signal line ML2. In this case, the ground voltage VSS may be applied to the second signal line ML2 and the third signal line ML3. That is, a voltage applied to the second signal line ML2 may be identical to the voltage applied to the particular bit line, and a voltage applied to the third signal line ML3 may be identical to the non-selection voltage applied to the particular word line. An example is illustrated in FIG. 6 as the voltage applied to the second signal line ML2 and the third signal line ML3 is the ground voltage VSS, but the inventive concepts are not limited thereto. The voltage applied to the second signal line ML2 and the third signal line ML3 may vary with the voltage applied to the particular bit line and the non-selection voltage applied to the particular word line.

As such, the monitor memory cell array 112 may be configured to be identical to one column of the normal memory cell array 111. Also, the voltage applied to the monitor memory cells MMC may be identical to the voltage applied to unselected memory cells MC of the normal memory cell array 111, and thus the monitor memory cells MMC may operate to be the same as or substantially identical to the unselected memory cells MC. For example, a leakage current flowing in unselected memory cells MC may be the same as or substantially identical to the leakage current ILK flowing in the monitor memory cells MMC.

The reference memory cell array 113 may include a plurality of reference memory cells RMC. Each of the reference memory cells RMC may include the cell transistor TR, but may not include the variable resistance element VR. In some example embodiments, even though the reference memory cell RMC includes the variable resistance element VR, the variable resistance element VR may be in a shorted state. A first end of the cell transistor TR is connected to a reference bit line RBL, and a second end thereof is connected to a reference source line RSL. A gate of the cell transistor TR is connected to a particular word line.

The data input/output circuit 130 may include first to seventh switches s1 to s7, a reference resistor Rref, and the sense amplifier 131. The first to seventh switches s1 to s7 may be closed or opened according to a read operation of the data input/output circuit 130. For example, in a read operation associated with a selected memory cell MC connected to the first bit line BL1 and the first source line SL1, the first switch s1, the second switch s2, the third switch s3, the fourth switch s4, and the seventh switch s7 may be closed, and the remaining switches s5 and s6 may be opened.

In the read operation, a reference signal SIREF may be provided to the sense amplifier 131 as the first switch s1 and the second switch s2 are closed. The reference signal SIREF may be a voltage or a current which is output according to an operation of the reference memory cell array 113. As the seventh switch s7 is closed, the ground voltage VSS may be applied to one of the bit lines BL1 to BLn.

The reference signal SIREF output by the reference memory cell array 113 may be determined through the reference resistor Rref. That is, a voltage or a current which is provided to the sense amplifier 131 may vary with a value of the reference resistor Rref. For example, the reference resistor Rref may have a resistance value of the variable resistance element VR corresponding to the low value or a resistance value of the variable resistance element VR corresponding to the high value.

The sense amplifier 131 may receive the reference signal SIREF provided through the reference source line RSL and an input signal SIIN provided through one of the source lines SL1 to SLn. The sense amplifier 131 may amplify a difference of the received signals SIREF, and SIIN and may output the amplified signal. The reference signal SIREF may have a fixed value which is determined according to the reference resistor Rref. The input signal SIIN may have a value which varies with a resistance value of the variable resistance element VR (e.g., with data stored in a memory cell MC). As such, a signal which is output from the sense amplifier 131 may vary with the input signal SIIN. Data stored in the memory cell MC may be determined through the signal output from the sense amplifier 131.

As described above, in the read operation, the reference memory cell array 113 may output the reference signal SIREF for determining data stored in the normal memory cell array 111.

The body bias generator 200 may include a leakage current generator 210, a pump enable circuit 220, a negative charge pump 230, and a clamping circuit 240. The leakage current generator 210 may provide the leakage current ILK to the monitor memory cell array 112 and the pump enable circuit 220. The leakage current generator 210 may provide the leakage current ILK to the monitor memory cell array 112 through the first signal line ML1. The provided leakage current ILK may flow to the monitor memory cells MMC.

In an example embodiment, the leakage current generator 210 may apply a voltage the same as or substantially identical to a voltage of a first node no1, to the first signal line ML1. The first node no1 may be an output node (or an input node) of the normal memory cell array 111. For example, a voltage of the first node no1 may be a read voltage which is applied to the normal memory cell array 111. In the case where a voltage which is the same as or substantially identical to the voltage of the first node no1 is applied to the first signal line ML1, the leakage current ILK which is the same as or substantially identical to a leakage current flowing to the normal memory cell array 111 may flow to the monitor memory cell array 112. An operation of the leakage current generator 210 will be in detail described with reference to FIGS. 10 and 11.

The pump enable circuit 220 may determine whether the leakage current ILK is greater than a threshold value. The pump enable circuit 220 may provide an enable signal EN to the negative charge pump 230 depending on a result of the determination. For example, in the case where the leakage current ILK is greater than the threshold value, the enable signal EN may be provided to the negative charge pump 230. In the case where the leakage current ILK is not greater than the threshold value, the enable signal EN may not be output.

The pump enable circuit 220 may include a comparator 221 and a variable resistor 222. The comparator 221 may compare a threshold voltage VTR with a leakage voltage VDET, which is determined based on the leakage current ILK. In the case where the leakage voltage VDET is greater than the threshold voltage VTR, the comparator 221 may output the enable signal EN. The leakage voltage VDET may be determined according to the leakage current ILK and the variable resistor 222. The leakage voltage VDET input to the comparator 221 may be adjusted as the variable resistor 222 is adjusted. As such, an output of the enable signal EN may be controlled as the variable resistor 222 is adjusted.

The negative charge pump 230 may receive the enable signal EN. The negative charge pump 230 may decrease the body voltage VBB in response to the enable signal EN. For example, as the negative charge pump 230 operates, the body voltage VBB may become smaller than the ground voltage VSS The clamping circuit 240 may sense the body voltage VBB. The clamping circuit 240 may clamp the body voltage VBB to a desired (or alternatively, preset) voltage such that the body voltage VBB is not higher than the desired (or alternatively, preset) voltage. For example, the clamping circuit 240 may sense that the body voltage VBB is higher than the ground voltage VSS and may clamp the body voltage VBB to the ground voltage VSS. An operation of the clamping circuit 240 will be in detail described with reference to FIG. 12.

As described above, the memory device 1000 may include the monitor memory cell array 112 which is configured to be identical to the normal memory cell array 111. The memory device 1000 may apply a voltage the same as or substantially identical to a voltage (e.g., a read voltage) applied to the normal memory cell array 111, to the monitor memory cell array 112 through the body bias generator 200. As such, the leakage current ILK which is the same as or substantially identical to a leakage current flowing in the normal memory cell array 111 may be provided to the monitor memory cell array 112. In this case, the leakage current ILK may be sensed by the memory device 1000. The memory device 1000 may adjust the body voltage VBB based on the leakage current ILK.

The sense amplifier 131 is illustrated in FIG. 6 as being connected to the reference source line RSL and the source lines SL1 to SLn, but the inventive concepts are not limited thereto. For example, the sense amplifier 131 may be connected to the reference bit line RBL and the bit lines BL1 to BLn. In this case, the ground voltage VSS may be applied to the reference source line RSL and the source lines SL1 to SLn.

Figure 7:
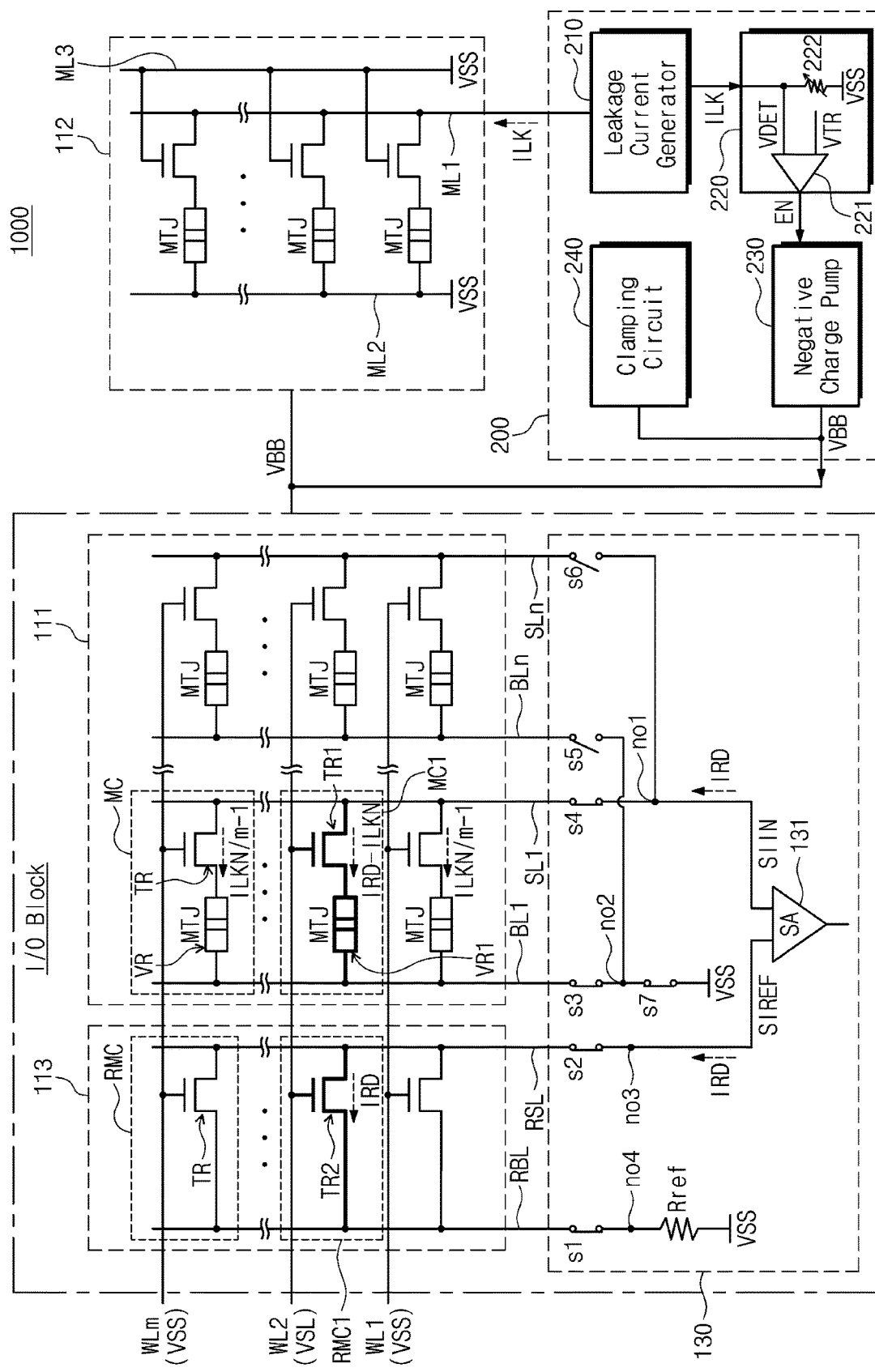
FIG. 7 is a diagram illustrating an example of a read operation of a memory device of FIG. 6.

FIG. 7 is a diagram illustrating an example of a read operation of the memory device 1000 of FIG. 6. Referring to FIG. 7, the memory device 1000 may perform a read operation on a memory cell MC1. To output data stored in the memory cell MC1, a selection voltage VSL may be applied to the second word line WL2 connected to the memory cell MC1. As such, cell transistors connected to the second word line WL2 may be turned on. For example, the selection voltage VSL may be 1.8 V. The ground voltage VSS may be applied to the remaining word lines WL1 and WL3 to WLm other than the second word line WL2. In this case, cell transistors connected to the word lines WL1 and WL3 to WLm may be turned off. For example, the ground voltage VSS may be 0 V.

To output data stored in the memory cell MC1, the first to fourth switches s1 to s4 and the seventh switch s7 may be closed. In this case, the reference source line RSL and the first source line SL1 may be connected to the sense amplifier 131. A voltage (e.g., the read voltage) may be applied to the reference source line RSL and the first source line SL1, respectively. In this case, a read current IRD may be provided to the reference source line RSL and the first source line SL1. The reference bit line RBL may be connected to the reference resistor Rref. The read current IRD provided to the reference source line RSL may flow to the reference bit line RBL through a cell transistor TR2 of a reference memory cell RMC1. Also, the ground voltage VSS may be applied to the first bit line BL1. The read current IRD provided to the first source line SL1 may flow to the bit line BL1 through a cell transistor TR1 of the memory cell MC1.

The sense amplifier 131 may sense data stored in the memory cell MC1, based on the reference signal SIREF and the input signal SIIN received according to a flow of the read current IRD. For example, the reference signal SIREF may be determined by multiplying a resistance value of the reference resistor Rref and the read current IRD. The input signal SIIN may be determined by multiplying a resistance value of a variable resistance element VR1 in the memory cell MC1 and the read current IRD. Accordingly, the sense amplifier 131 may sense data stored in the memory cell MC1 from a difference between a resistance value of the reference resistor Rref and a resistance value of the variable resistance element VR1.

However, in the case where a temperature increases, threshold voltages of the cell transistors TR may decrease. In this case, a leakage current may be generated or increased. Because the memory cell MC of the normal memory cell array 111 includes the variable resistance element VR, a voltage difference between opposite ends (e.g., the first node no1 and a second node no2) of the memory cell MC may be greater than a voltage difference between opposite ends (e.g., a third node no3 and a fourth node no4) of the reference memory cell RMC. In such cases, a leakage current ILKN of the normal memory cell array 111 may be significantly greater than a leakage current of the reference memory cell array 113, and thus, it may be assumed that a leakage current of the reference memory cell array 113 does not exist or is negligible with respect to the leakage current ILKN. For example, as illustrated in FIG. 7, the remaining current (IRD−ILKN), which corresponds to the read current IRD flowing to the first source line SL1 except for the leakage current ILKN, may be provided to the memory cell MC1. However, when the leakage current of the reference memory cell array 113 is negligible, it may be assumed that the whole read current IRD flowing to the reference source line RSL may be provided to the reference memory cell RMC1.

As such, in the case where the leakage current ILKN of the normal memory cell array 111 and the leakage current of the reference memory cell array 113 are not matched, a difference between the reference signal SIREF and the input signal SIIN input to the sense amplifier 131 may change.

Accordingly, a signal output from the sense amplifier 131 may change. In this case, an error may occur with regard to output data.

The body bias generator 200 may adjust the body voltage VBB based on the leakage current ILK which is the same as or substantially identical to the leakage current ILKN. In the case where the body voltage VBB is adjusted, threshold voltages Vth of the cell transistors TR may increase, thus mitigating or preventing the leakage current ILKN from being generated or mitigating or preventing an increase of the leakage current ILKN. For example, even though a temperature increases, the leakage current ILK may be controlled not to increase by adjusting the body voltage VBB. That is, the memory device 1000 may adjust the leakage current ILKN such that a data error does not occur in the read operation.

Figure 8:
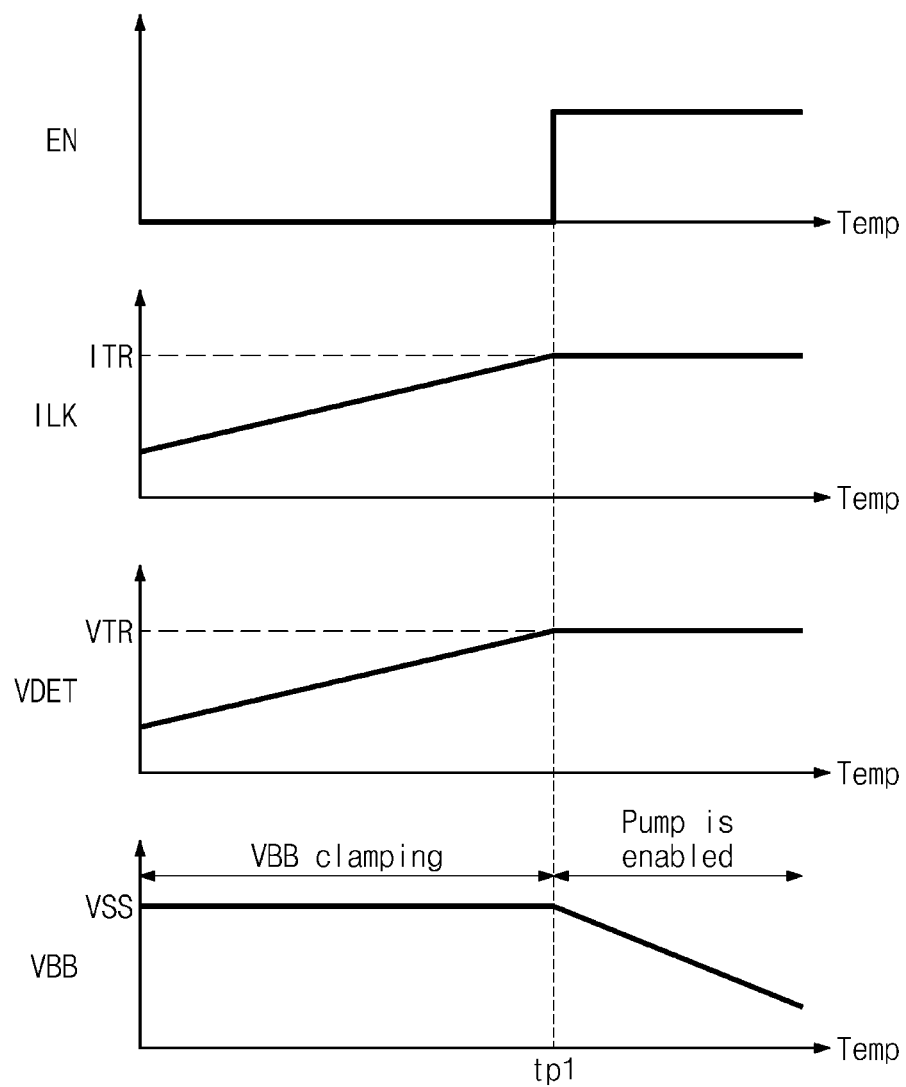
FIG. 8 is a diagram illustrating signals which vary in accordance with an operation of a body bias generator of FIG. 6.

FIG. 8 is a diagram illustrating signals which vary in accordance with an operation of the body bias generator 200 of FIG. 6. Each horizontal axis of FIG. 8 indicates a temperature. The enable signal EN, the leakage current ILK, the leakage voltage VDET, and the body voltage VBB which vary as a temperature changes are illustrated in FIG. 8.

The leakage current ILK may increase as a temperature increases. The leakage voltage VDET which is based on the leakage current ILK may also increase as a temperature increases. Even though the leakage current ILK or the leakage voltage VDET increase, in the case where the leakage current ILK is not greater than a threshold current ITR or the leakage voltage VDET is not greater than the threshold voltage VTR, the enable signal EN may not be output (e.g., the enable signal EN is set to a low value). In this case, the body voltage VBB may be clamped such that the body voltage VBB is not higher than the ground voltage VSS. Accordingly, the body voltage VBB may be fixed to the ground voltage VSS.

In the case where the temperature increases to a first temperature tp1, the leakage current ILK may be greater than the threshold current ITR, and the leakage voltage VDET may be greater than the threshold voltage VTR. In this case, the enable signal EN may be output. The body bias generator 200 may decrease the body voltage VBB in response to the enable signal EN. The body bias generator 200 may continuously decrease the body voltage VBB while the enable signal EN is output. Accordingly, even though the temperature continues to increase, the leakage current ILK may not be greater than the threshold current ITR, and the leakage voltage VDET may not be greater than the threshold voltage VTR.

Figure 9:
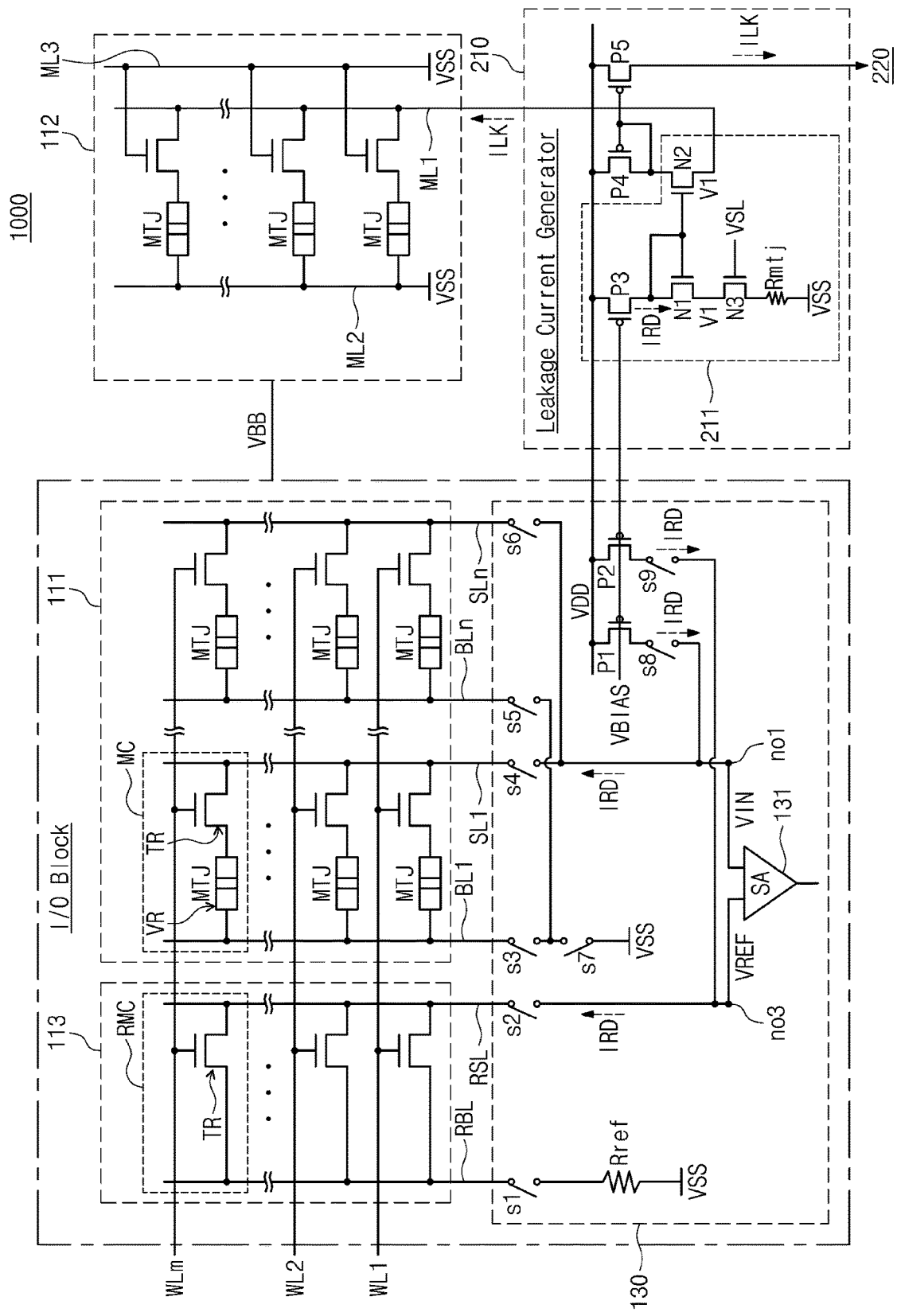
FIG. 9 is a diagram illustrating an example of a data input/output circuit and a leakage current generator included in a memory device of FIG. 6.

FIG. 9 is a diagram illustrating an example of the data input/output circuit 130 and the leakage current generator 210 included in the memory device 1000 of FIG. 6. Referring to FIG. 9, the data input/output circuit 130 may include a first PMOS transistor P1, a second PMOS transistor P2, an eighth switch s8, a ninth switch s9, and the sense amplifier 131. The first PMOS transistor P1 has a first end to which the power supply voltage VDD is applied and a second end connected to a first end of the eighth switch s8. The second PMOS transistor P2 has a first end to which the power supply voltage VDD is applied and a second end connected to a first end of the ninth switch s9. A second end of the eighth switch s8 is connected to the first node no1, and a second end of the ninth switch s9 is connected to the third node no3. The first node no1 may be an output node (or an input node) of the normal memory cell array 111. The third node no3 may be an output node (or an input node) of the reference memory cell array 113.

In a read operation, when the eighth switch s8 and the ninth switch s9 are closed, the read current IRD may be output through the first PMOS transistor P1 and the second PMOS transistor P2 based on the power supply voltage VDD. The read current IRD may be provided to the normal memory cell array 111 and the reference memory cell array 113.

The sense amplifier 131 may sense an input voltage VIN of the first node no1 and a reference voltage VREF of the third node no3. For example, the input voltage VIN may be determined by multiplying the read current IRD and a resistance value of the variable resistance element VR. The reference voltage VREF may be determined by multiplying the read current IRD and a resistance value of the reference resistor Rref. The sense amplifier 131 may amplify a difference between the reference voltage VREF and the input voltage VIN, and may output read data.

As described above, the memory device 1000 illustrated in FIG. 9 may include the sense amplifier 131 which uses a voltage as an input.

The leakage current generator 210 may include a voltage replica circuit 211. The voltage replica circuit 211 may generate a first voltage V1 which is the same as or substantially identical to a voltage (e.g., the input voltage VIN) of the first node no1. As the first voltage V1 is applied to the first signal line ML1, the leakage current ILK may be provided to the monitor memory cell array 112.

The leakage current generator 210 may include third to fifth PMOS transistors P3 to P5, first to third NMOS transistors N1 to N3, and a replica resistor Rmtj. The third PMOS transistor P3 has a first end to which the power supply voltage VDD is applied and a second end connected to a first end of the first NMOS transistor N1. The first end of the first NMOS transistor N1 is connected to a common node of a gate of the first NMOS transistor N1 and a gate of the second NMOS transistor N2. A second end of the first NMOS transistor N1 is connected to a first end of the third NMOS transistor N3. A second end of the third NMOS transistor N3 is connected to a first end of the replica resistor Rmtj, and the selection voltage VSL is applied to a gate of the third NMOS transistor N3. The ground voltage VSS is applied to a second end of the replica resistor Rmtj. The power supply voltage VDD is applied to a first end of the fourth PMOS transistor P4, and a gate of the fourth PMOS transistor P4 is connected to the first end of the second NMOS transistor N2 and a common node of a gate of the fourth PMOS transistor P4 and a gate of the fifth PMOS transistor P5. A second end of the second NMOS transistor N2 is connected to the first signal line ML1. The power supply voltage VDD is applied to a first end of the fifth PMOS transistor P5.

The third PMOS transistor P3, the first to third NMOS transistors N1 to N3, and the replica resistor Rmtj may constitute the voltage replica circuit 211. In the case where the read current IRD is provided through the third PMOS transistor P3 and the first NMOS transistor N1, a voltage of the first end of the third NMOS transistor N3 (e.g., the second end of the first NMOS transistor N1) may be the first voltage V1. The replica resistor Rmtj may have the same resistance value as the resistance value of the variable resistance element VR. For example, the replica resistor Rmtj may have the same resistance value as the resistance value of the variable resistance element VR of the selected memory cell MC. An operation of the replica resistor Rmtj and the third NMOS transistor N3 may be the same as or substantially similar to an operation of the selected memory cell MC of the normal memory cell array 111. Accordingly, the first voltage V1 may be the same as or substantially identical to the voltage of the first node no1.

The first NMOS transistor N1 and the second NMOS transistor N2 may operate as a source follower. In this case, a voltage of the second end of the second NMOS transistor N2 may also be the first voltage V1. Accordingly, the first voltage V1 may be applied to the first signal line ML1.

The fourth PMOS transistor P4 and the fifth PMOS transistor P5 may operate as a current mirror. In this case, the same current may be output from each of the fourth PMOS transistor P4 and the fifth PMOS transistor P5. A current flowing through the fourth PMOS transistor P4 may be identical to a current flowing through the second NMOS transistor N2. Accordingly, the current output from the fourth PMOS transistor P4 may be the leakage current ILK and the current output from the fifth PMOS transistor P5 may be the leakage current ILK. Thus, the leakage current generator 210 may provide the leakage current ILK to the pump enable circuit 220.

As described above, in the case where the sense amplifier 131 using a voltage as an input is adopted, the leakage current generator 210 corresponding to the sense amplifier 131 may be implemented.

Figure 10:
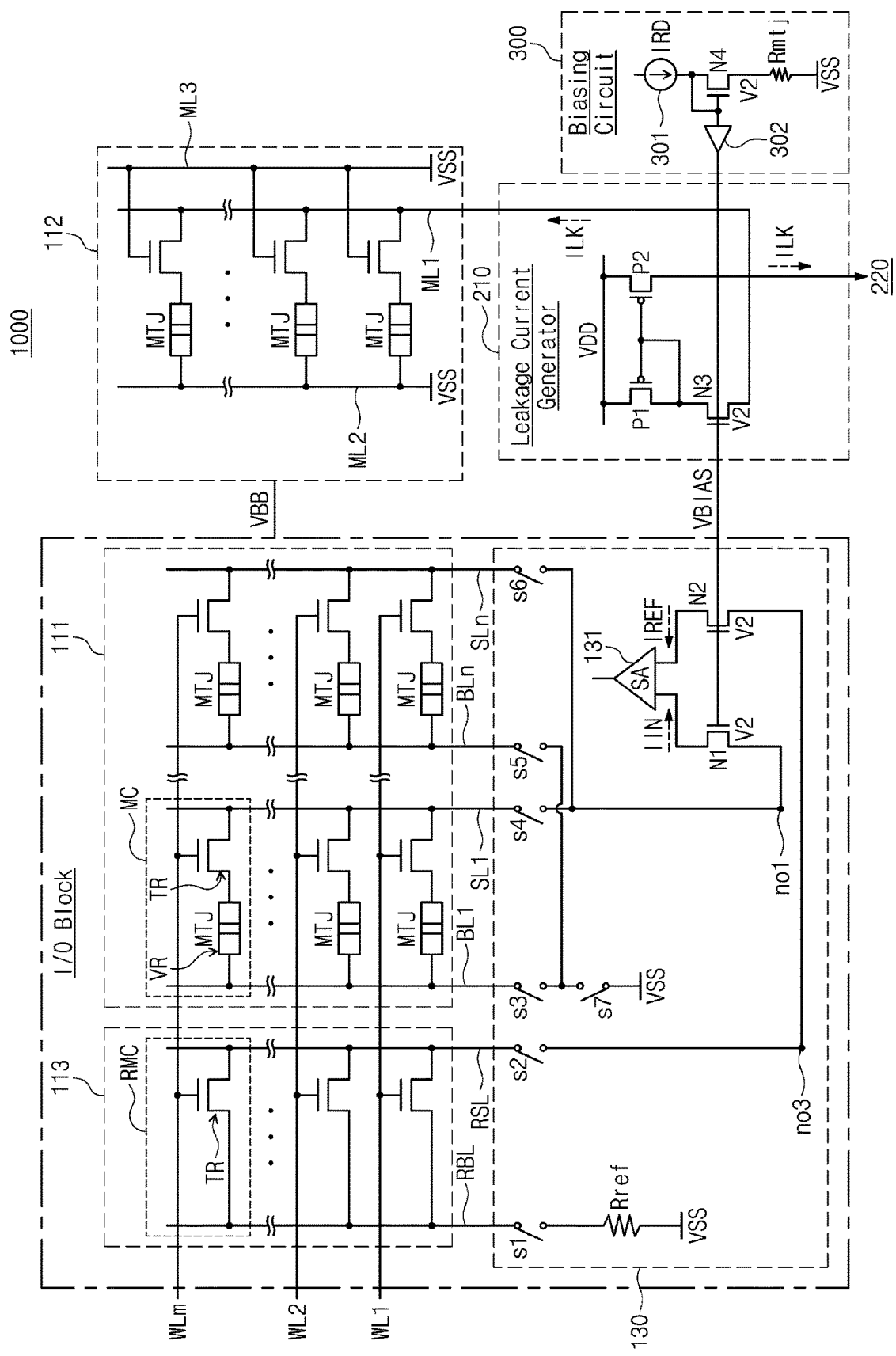
FIG. 10 is a diagram illustrating another example of a data input/output circuit and a leakage current generator included in a memory device of FIG. 6.

FIG. 10 is a diagram illustrating another example of the data input/output circuit 130 and the leakage current generator 210 included in the memory device 1000 of FIG. 6. Referring to FIG. 10, the memory device 1000 may further include a biasing circuit 300. The biasing circuit 300 may include a current source 301, a buffer 302, a fourth NMOS transistor N4, and a replica resistor Rmtj. The current source 301 may provide the read current RD to a common node of a first end and a gate of the fourth NMOS transistor N4. A second end of the fourth NMOS transistor N4 is connected to a first end of the replica resistor Rmtj, and a gate of the fourth NMOS transistor N4 is connected to an input of the buffer 302. The ground voltage VSS is applied to a second end of the replica resistor Rmtj. The replica resistor Rmtj may have the same resistance value as the resistance value of the variable resistance element VR. For example, the replica resistor Rmtj may have the same resistance value as the resistance value of the variable resistance element VR of the selected memory cell MC. In the case where the read current IRD is provided to the first end of the fourth NMOS transistor N4, the second end of the fourth NMOS transistor N4 may be a second voltage V2. In this case, the second voltage V2 may be determined by multiplying the read current IRD and a resistance value of the replica resistor Rmtj. Accordingly, the second voltage V2 may be identical to the read voltage which is provided to the normal memory cell array 111. The buffer 302 may output a bias voltage VBIAS based on the received read current IRD.

The data input/output circuit 130 may include a first NMOS transistor N1, a second NMOS transistor N2, and the sense amplifier 131. A first end of the first NMOS transistor N1 is connected to a first input node of the sense amplifier 131, and a second end thereof is connected to the first node no1. A first end of the second NMOS transistor N2 is connected to a second input node of the sense amplifier 131, and a second end thereof is connected to the third node no3. The first node no1 may be an output node (or an input node) of the normal memory cell array 111. The third node no3 may be an output node (or an input node) of the reference memory cell array 113.

In a read operation, the bias voltage VBIAS may be applied to the gates of the NMOS transistors N1 and N2 by the biasing circuit 300. In this case, the first NMOS transistor N1, the second NMOS transistor N2, and the fourth NMOS transistor N4 may operate as a source follower. As such, the second ends of the first and second NMOS transistors N1 and N2 may be fixed to a voltage (e.g., the second voltage V2) of the second end of the fourth NMOS transistor N4. In this case, a read current which is provided to the normal memory cell array 111 may be different from a read current which is provided to the reference memory cell array 113.

The sense amplifier 131 may sense an input current IIN provided to a first input node and a reference current IREF provided to a second input node. The input current IIN may correspond to a value obtained by dividing the second voltage V2 by a resistance value of the variable resistance element VR. That is, a magnitude of the input current IIN may be identical to a magnitude of the read current provided to the normal memory cell array 111. The reference current IREF may correspond to a value obtained by dividing the second voltage V2 by a resistance value of the reference resistor Rref. That is, a magnitude of the reference current IREF may be identical to a magnitude of the read current provided to the reference memory cell array 113. The sense amplifier 131 may amplify a difference of the input current IIN and the reference current IREF and may output data.

As described above, the memory device 1000 illustrated in FIG. 10 may include the sense amplifier 131 using a current as an input.

The leakage current generator 210 may include a first PMOS transistor P1, a second PMOS transistor P2, and a third NMOS transistor N3. The power supply voltage VDD is applied to a first end of the first PMOS transistor P1, and a second end of the first PMOS transistor P1 is connected to a first end of the third NMOS transistor N3 and a common node of a gate of the first PMOS transistor P1 and a gate of the second PMOS transistor P2. A second end of the third NMOS transistor N3 is connected to the first signal line ML1. The power supply voltage VDD is applied to the first end of the second PMOS transistor P2. The bias voltage VBIAS provided from the biasing circuit 300 is applied to a gate of the third NMOS transistor N3. In this case, the third NMOS transistor N3 and the fourth NMOS transistor N4 may operate as a source follower, and thus, a voltage of the second end of the third NMOS transistor N3 may be fixed to a voltage (e.g., the second voltage V2) of the second end of the fourth NMOS transistor N4.

The voltage V2 of the second end of the third NMOS transistor N3 may be identical to the voltage V2 of the second end of the first NMOS transistor N1. Accordingly, the second voltage V2 which is identical to a voltage provided to the normal memory cell array 111 may be applied to the first signal line ML1. The leakage current ILK may be provided to the first signal line ML1 by the second voltage V2.

The first PMOS transistor P1 and the second PMOS transistor P2 may operate as a current mirror. In this case, the same current may be output from the first PMOS transistor P1 and the second PMOS transistor P2. A current flowing through the first PMOS transistor P1 may be identical to a current flowing through the third NMOS transistor N3. The leakage current ILK may be output from the third NMOS transistor N3, and thus the leakage current ILK may be output from the first PMOS transistor P1 and the second PMOS transistor P2. Thus, the leakage current generator 210 may provide the leakage current ILK to the pump enable circuit 220.

Figure 11:
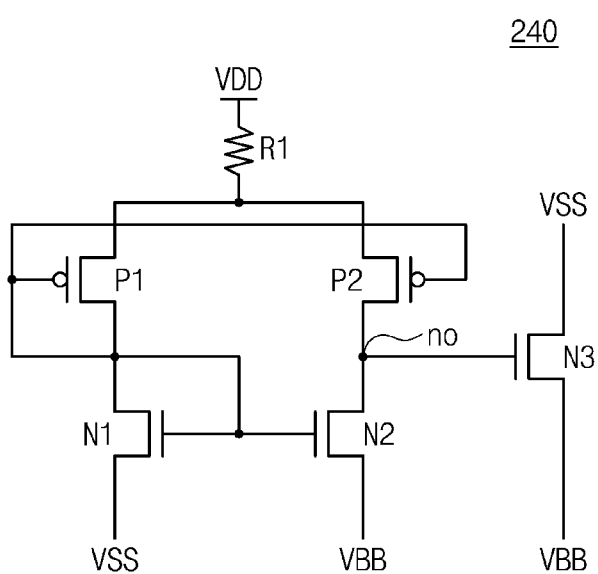
FIG. 11 is a circuit diagram illustrating an example of a clamping circuit of FIG. 6.

FIG. 11 is a circuit diagram illustrating an example of the clamping circuit 240 of FIG. 6. Referring to FIG. 11, the clamping circuit 240 may include a first resistor R1, a first PMOS transistor P1, a second PMOS transistor P2, first to third NMOS transistors N1 to N3. The power supply voltage VDD is applied to a first end of the first resistor R1, and a second end of the first resistor R1 is connected to a common node of a first end of the first PMOS transistor P1 and a first end of the second PMOS transistor P2. A second end of the first PMOS transistor P1 is connected to a first end of the first NMOS transistor N1. The first end of the first NMOS transistor N1 is connected to a gate of the second NMOS transistor N2 and a common node of a gate of the first PMOS transistor P1 and a gate of the second PMOS transistor P2. The ground voltage VSS is applied to a second end of the first NMOS transistor N1. A second end of the second PMOS transistor P2 is connected to a common node of the first end of the second NMOS transistor N2 and a gate of the third NMOS transistor N3. A second end of the second NMOS transistor N2 is connected to a node to which the body voltage VBB is provided. The ground voltage VSS is applied to a first end of the third NMOS transistor N3, and a second end of the third NMOS transistor N3 is connected to the node to which the body voltage VBB is provided.

In the case where the body voltage VBB is identical to the ground voltage VSS, a gate voltage of the first NMOS transistor N1 may be identical to a gate voltage of the second NMOS transistor N2. In this case, a current flowing through the first NMOS transistor N1 may be identical to a current flowing through the second NMOS transistor N2. In the case where the body voltage VBB is greater than the ground voltage VSS, a current flowing through the first NMOS transistor N1 may be greater than a current flowing through the second NMOS transistor N2. As such, a voltage of a node "no" may increase. The first resistor R1, the first PMOS transistor P1, and the second PMOS transistor P2 may operate as a differential amplifier. In this case, the voltage of the node "no" may be amplified by the first resistor R1, the first PMOS transistor P1, and the second PMOS transistor P2. In the case where the voltage of the node "no" increases, the third NMOS transistor N3 may be turned on, and thus, the body voltage VBB may be fixed to the ground voltage VSS.

In the case where the body voltage VBB is greater than the ground voltage VSS, a threshold voltage Vth of a cell transistor may decrease. This may mean that a leakage current flowing through the cell transistor is further increased. The clamping circuit 240 may sense the body voltage VBB, and may decrease the body voltage VBB to the ground voltage VSS when the body voltage VBB is higher than the ground voltage VSS. Accordingly, the clamping circuit 240 may mitigate or prevent a leakage current flowing through the cell transistor from being further increased.

Figure 12:
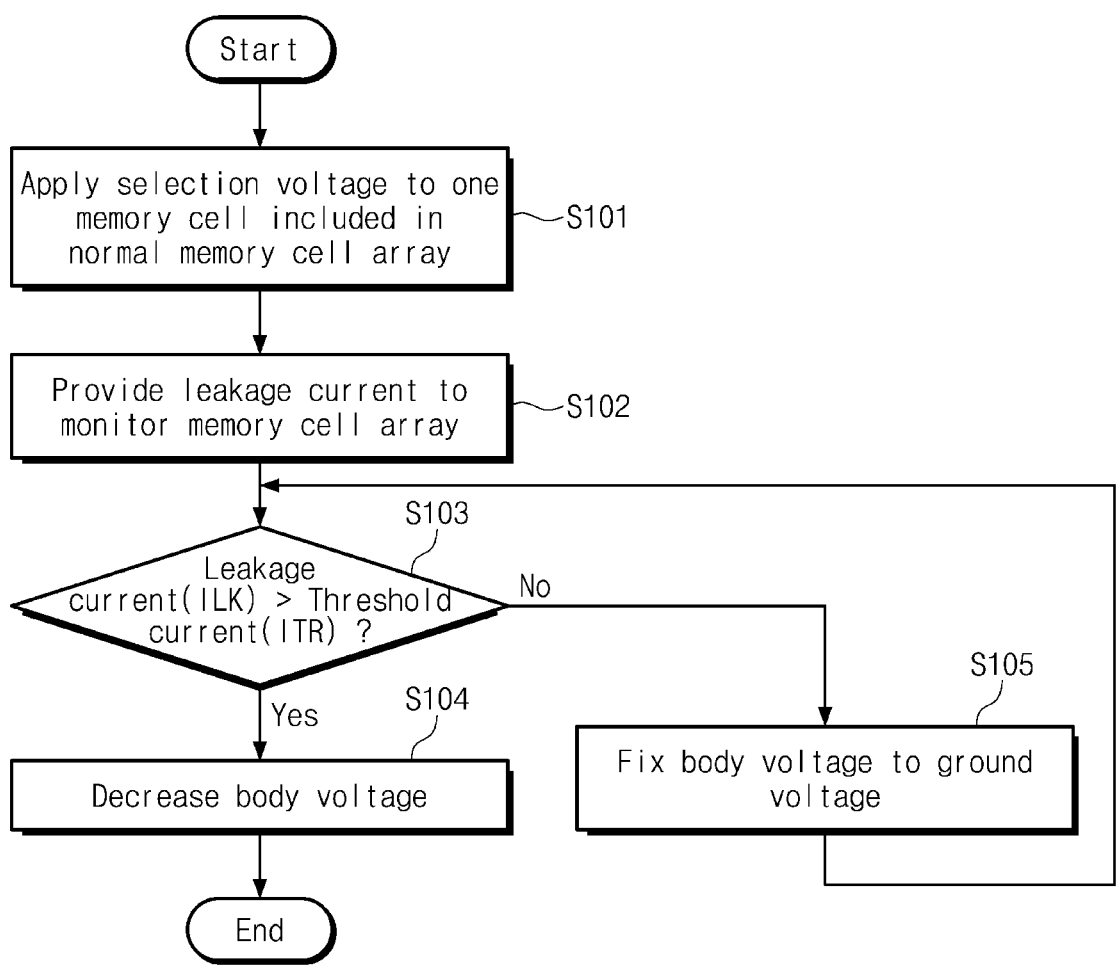
FIG. 12 is a flowchart illustrating an operation of a memory device according to an example embodiment of the inventive concepts.

FIG. 12 is a flowchart illustrating an operation of a memory device according to an example embodiment of the inventive concepts. Referring to FIGS. 4 and 12, in operation S101, the memory device 1000 may apply the selection voltage to one memory cell included in the normal memory cell array 111. For example, the memory device 1000 may apply the selection voltage to a word line connected to the memory cell.

In operation S102, the memory device 1000 may provide the leakage current ILK to the monitor memory cell array 112. In operation S103, the memory device 1000 may determine whether the leakage current ILK is greater than the threshold current ITR. In the case where the leakage current ILK is greater than the threshold current ITR, in operation S104, the memory device 1000 may decrease the body voltage VBB. In the case where the leakage current ILK is not greater than the threshold current ITR, in operation S105, the memory device 1000 may fix the body voltage VBB to the ground voltage VSS.

The components of the memory device 1000 described with reference to FIGS. 1 to 12 may be implemented in the form of software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, a microelectromechanical system (MEMS), a passive element, or a combination thereof.

Figure 13:
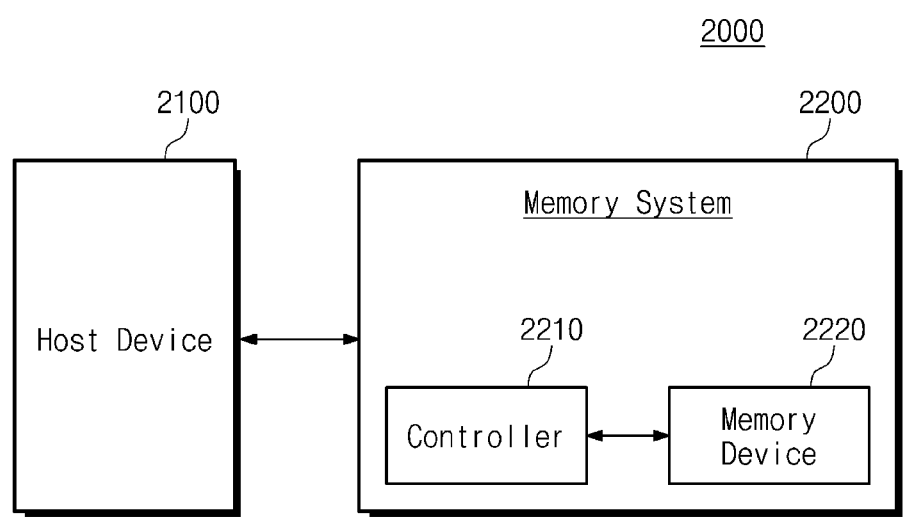
FIG. 13 is a block diagram illustrating an electronic system according to an example embodiment of the inventive concepts.

FIG. 13 is a block diagram illustrating an electronic system 2000 according to an example embodiment of the inventive concepts. Referring to FIG. 13, the electronic system 2000 may include a host device 2100 and a memory system 2200. For example, the electronic system 2000 may be implemented in electronic devices such as a desktop computer, a laptop computer, a tablet computer, a smartphone, a wearable device, a video game console, a server, an electric vehicle, home appliances, and a medical device.

The host device 2100 may be an electronic device which may perform operations desired by the electronic system 2000. To this end, the host device 2100 may store data in the memory system 2200 or may read data stored in the memory system 2200.

The host device 2100 may be, for example, a main processor (e.g., a central processing unit (CPU) or an application processor (AP)), a dedicated processor (e.g., a graphic processing unit (GPU) or a Modulator/Demodulator (MODEM)), or an image sensor. The host device 2100 may be any device which is configured to use the memory system 2200.

The memory system 2200 may store data which are used for an operation of the electronic system 2000. For example, the memory system 2200 may store write data requested by the host device 2100 or may provide read data requested by the host device 2100 to the host device 2100.

To this end, the memory system 2200 may include a controller 2210 and one or more nonvolatile memory devices 2220. The controller 2210 may control overall operations of the memory system 2200. In an example embodiment, the controller 2210 may control the memory device 2220 in response to a request of the host device 2100 such that data are stored to the memory device 2220 or are read from the memory device 2220. For example, the controller 2210 may provide various operations, for example, a data error correction operation, a performance management operation, and/or an attack prevention operation.

The memory device 2220 may include a memory element configured to store data and output stored data. For example, the memory element may include a volatile memory element and/or a nonvolatile memory element. The memory device 2220 may include the memory device 1000 described with reference to FIGS. 1 to 12.

According to the inventive concepts, there may be provided a memory device which may adjust a leakage current flowing to memory cells and an operating method thereof.

Also, the memory device according to some example embodiments may mitigate or prevent a leakage current flowing to memory cells from increasing even though a temperature increases. Accordingly, the probability that an error of output data occurs may decrease, and reliability of the memory device may be improved.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:

1. A memory device comprising:
a normal memory cell array including a first magneto-resistance memory cell, the first magneto-resistance memory cell connected to a first bit line, a first source line, and a first word line, the first magneto-resistance memory cell configured to receive a selection voltage through the first word line;
a monitor memory cell array including a second magneto-resistance memory cell, the second magneto-resistance memory cell connected to a first signal line and a second signal line, a gate of a cell transistor of the second magneto-resistance memory cell configured to receive a non-selection voltage; and
a body bias generator configured to sense a leakage current flowing through the first signal line, and control a body voltage provided to each of a body of a cell transistor of the first magneto-resistance memory cell and a body of the cell transistor of the second magneto-resistance memory cell based on the leakage current.

2. The memory device of claim 1, wherein
when the leakage current is greater than a threshold value, the body bias generator is configured to decrease the body voltage based on the leakage current, and
when the leakage current is not greater than the threshold value, the body bias generator is configured to fix the body voltage to a ground voltage.

3. The memory device of claim 1, wherein the memory device is configured to apply a ground voltage to one of the first bit line or the first source line, a read voltage to the other of the first bit line or the first source line, and the ground voltage to the second signal line.

4. The memory device of claim 3, wherein the body bias generator is configured to apply a particular voltage substantially identical to the read voltage to the first signal line, and flow the leakage current based on the particular voltage.

5. The memory device of claim 3, further comprising:
a data input/output circuit configured to output data stored in the first magneto-resistance memory cell based on a signal output through the first bit line or the first source line in response to the applied ground voltage and the applied read voltage.

6. The memory device of claim 1, further comprising:
a reference memory cell array including a reference memory cell, the reference memory cell including a cell transistor and not including a variable resistance element, the reference memory cell connected to a second bit line, a second source line, and the first word line, the reference memory cell configured to receive the selection voltage through the first word line; and
a reference resistor connected to the second bit line.

7. The memory device of claim 6, further comprising:
a sense amplifier configured to amplify a difference of a reference signal provided from the reference memory cell array and an input signal provided from the normal memory cell array.

8. The memory device of claim 1, wherein
the normal memory cell array includes a plurality of first magneto-resistance memory cells, the plurality of first magneto-resistance memory cells including the first magneto-resistance memory cell and connected to the first bit line and the first source line, an entirety of the plurality of first magneto-resistance memory cells other than the first magneto-resistance memory cell configured to receive the non-selection voltage, and
the leakage current flowing through the first signal line is substantially identical to a leakage current flowing in the entirety of plurality of first magneto-resistance memory cells other than the first magneto-resistance memory cell.

9. A memory device comprising:
a normal memory cell array including a first magneto-resistance memory cell, the first magneto-resistance memory cell connected to a first bit line, a first source line, and a first word line, the first magneto-resistance memory cell configured to receive a selection voltage through the first word line;
a monitor memory cell array including a second magneto-resistance memory cell, the second magneto-resistance memory cell connected to a first signal line and a second signal line, a gate of a cell transistor of the second magneto-resistance memory cell configured to receive a non-selection voltage;
a leakage current generator configured to sense a leakage current flowing through the first signal line; and
a negative charge pump configured to control a body voltage provided to each of a body of a cell transistor of the first magneto-resistance memory cell and a body of the cell transistor of the second magneto-resistance memory cell when the leakage current is greater than a threshold value.

10. The memory device of claim 9, further comprising:
a clamping circuit configured to sense the body voltage and fix the body voltage to a ground voltage when the sensed body voltage is higher than the ground voltage.

11. The memory device of claim 9, wherein the memory device is configured to apply a ground voltage to one of the first bit line or the first source line, a read voltage to the other of the first bit line or the first source line, a particular voltage substantially identical to the read voltage to the first signal line, and the ground voltage to the second signal line.

12. The memory device of claim 11, wherein the leakage current generator includes a voltage replica circuit configured to generate the particular voltage, and the voltage replica circuit including,
a replica resistor configured to have a resistance value substantially identical to a resistance value of a variable resistance element included in the first magneto-resistance memory cell, and
a metal oxide semiconductor (MOS) transistor connected to a first end of the replica resistor and configured to receive the selection voltage through a gate of the MOS transistor.

13. The memory device of claim 9, further comprising:
a reference memory cell array including a reference memory cell, the reference memory cell including a cell transistor and not including a variable resistance element, the reference memory cell connected to a second bit line, a second source line, and the first word line, the reference memory cell configured to receive the selection voltage through the first word line; and
a reference resistor connected to the second bit line.

14. The memory device of claim 13, further comprising:
a sense amplifier configured to amplify a difference of a reference signal provided from the reference memory cell array and an input signal provided from the normal memory cell array.

15. A memory device comprising:
- a normal memory cell array including normal magneto-resistance memory cells, the normal magneto-resistance memory cells connected to a first bit line, a first source line, and respective ones of a plurality of word lines;
- a monitor memory cell array including monitor magneto-resistance memory cells, the monitor magneto-resistance memory cells connected to a first signal line, a second signal line, and a third signal line, gates of cell transistors of the monitor magneto-resistance memory cells connected to the third signal line and configured to receive a non-selection voltage through the third signal line; and
- a body bias generator configured to sense a leakage current flowing through the first signal line, and control a body voltage provided to a body of each of cell transistors included in the normal magneto-resistance memory cells and the monitor magneto-resistance memory cells based on the leakage current.

16. The memory device of claim 15, wherein the memory device is configured to apply a selection voltage to a first word line from among the plurality of word lines, and the non-selection voltage to remaining word lines of the plurality of word lines.

17. The memory device of claim 16, wherein the memory device is configured to apply a ground voltage to one of the first bit line or the first source line, and a read voltage to the other of the first bit line or the first source line, a particular voltage substantially identical to the read voltage to the first signal line, and the ground voltage to the second signal line.

18. The memory device of claim 17, further comprising:
- a data input/output circuit configured to output data stored in a selected one normal magneto-resistance memory cell, which is connected to the first word line, from among the normal magneto-resistance memory cells, based on a signal output through the first bit line or the first source line in response to the applied ground voltage and the applied read voltage.

19. The memory device of claim 15, further comprising:
- a reference memory cell array including reference memory cells, the reference memory cells each including a cell transistor and not including a variable resistance element, the reference memory cells connected to a second bit line, a second source line, and respective ones of the plurality of word lines; and
- a reference resistor connected to the second bit line.

20. The memory device of claim 19, further comprising:
- a sense amplifier configured to amplify a difference of a reference signal provided from the reference memory cell array and an input signal provided from the normal memory cell array.

* * * * *